(12) United States Patent
Sundaram et al.

(10) Patent No.: US 10,608,311 B2
(45) Date of Patent: Mar. 31, 2020

(54) CABLE ASSEMBLY COMPRISING A SINGLE WIRE COUPLED TO A SIGNAL LAUNCHER AND HOUSED IN A FIRST COVER PORTION AND IN A SECOND FERRITE COVER PORTION

(71) Applicant: Intel Corporation, Santa Clara, CA (US)

(72) Inventors: Arvind Sundaram, Bangalore (IN); Ramaswamy Parthasarathy, Bangalore (IN); Ranjul Balakrishnan, Bangalore (IN); Vikas Mishra, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 399 days.

(21) Appl. No.: 15/440,983

(22) Filed: Feb. 23, 2017

(65) Prior Publication Data

US 2018/0241113 A1 Aug. 23, 2018

(51) Int. Cl.
*H01P 3/10* (2006.01)
*H01R 13/7193* (2011.01)
*H01R 43/24* (2006.01)
*H01Q 13/26* (2006.01)
*H01R 13/6477* (2011.01)
(Continued)

(52) U.S. Cl.
CPC ............... *H01P 3/10* (2013.01); *H01P 1/36* (2013.01); *H01P 5/08* (2013.01); *H01P 5/085* (2013.01); *H01P 11/001* (2013.01); *H01Q 1/38* (2013.01); *H01Q 1/42* (2013.01); *H01Q 1/48* (2013.01); *H01Q 13/02* (2013.01); *H01Q 13/26* (2013.01); *H01R 4/18* (2013.01); *H01R 13/24* (2013.01); *H01R 13/6477* (2013.01);
(Continued)

(58) Field of Classification Search
CPC ........................................................ H01P 3/10
USPC ........................................................ 333/240
See application file for complete search history.

(56) References Cited

U.S. PATENT DOCUMENTS 2,685,068 A 3/1950 Goubau
2,921,277 A 7/1956 Goubau
(Continued)

OTHER PUBLICATIONS

Glenn Elmore, "Introduction to the Propagating Wave on a Single Conductor," Corridor Systems, Jul. 27, 2009, 30 pages.
(Continued)

*Primary Examiner* — Benny T Lee
(74) *Attorney, Agent, or Firm* — Schwabe, Williamson & Wyatt, P.C.

(57) ABSTRACT

Embodiments of the present disclosure provide techniques and configurations for a cable assembly for single wire communications (SWC). In one instance, the cable assembly may comprise a wire having a wire end to couple with a signal launcher of an electronic device, and a first cover portion to house a first portion of the wire that extends from the wire end. The first cover portion may comprise a shape to conform to a shape of the signal launcher, and may be fabricated of a material with a dielectric constant above a threshold. The assembly may further comprise a second cover portion coupled with the first cover portion to house a second portion of the wire that extends from the first wire portion and protrudes from the first cover portion. The second cover portion may be fabricated of a ferrite material. Other embodiments may be described and/or claimed.

22 Claims, 5 Drawing Sheets

(51) Int. Cl.
  *H01P 5/08*    (2006.01)
  *H01P 1/36*    (2006.01)
  *H01P 11/00*   (2006.01)
  *H01Q 1/38*    (2006.01)
  *H01Q 1/42*    (2006.01)
  *H01Q 1/48*    (2006.01)
  *H01Q 13/02*   (2006.01)
  *H01R 4/18*    (2006.01)
  *H01R 13/24*   (2006.01)
  *H05K 1/18*    (2006.01)

(52) U.S. Cl.
  CPC ......... H01R 13/7193 (2013.01); H01R 43/24 (2013.01); *H05K 1/183* (2013.01)

(56) References Cited

U.S. PATENT DOCUMENTS

| | | | |
|---|---|---|---|
| 3,077,569 A * | 2/1963 | Ikrath | ............... H01P 3/10 174/28 |
| 5,459,635 A | 10/1995 | Tomozawa et al. | |
| 5,663,968 A | 9/1997 | Heuer | |
| 6,104,107 A | 8/2000 | Avramenko et al. | |
| 6,384,700 B1 | 5/2002 | Craine et al. | |
| 7,009,471 B2 | 3/2006 | Elmore | |
| 7,567,154 B2 | 7/2009 | Elmore | |
| 2005/0095998 A1 | 5/2005 | Toncich | |
| 2015/0093920 A1 | 4/2015 | Colantuono et al. | |
| 2018/0198484 A1* | 7/2018 | Bennett et al. | ......... H04B 3/54 |

OTHER PUBLICATIONS

Tahsin Akalin et al., "Single-Wire Transmission Lines at Terahertz Frequencies," IEEE Transactions on Microwave Theory and Techniques, vol. 54, No. 6, (Jun. 2006), pp. 2762-2767.

"E-Line", Corridor Systems, Inc. [online], (2010) [retrieved Jun. 28, 2017], retrieved from the Internet: <http://www.corridor.biz/News.html>.

Georg Goubau, "Surface Waves and Their Application to Transmission Lines," Journal of Applied Physics, vol. 21, (Nov. 1950), 11 pages.

Non-Final Office Action dated Sep. 27, 2018 for U.S. Appl. No. 15/473,330, 9 pages.

Helge Engan, "Waveguide Propagation," NTNU, Jan. 2006, 43 pages.

Notice of Allowance dated Mar. 15, 2019 for U.S. Appl. No. 15/473,330, 11 pages.

Non-Final Office Action dated Feb. 6, 2020 for U.S. Appl. No. 15/440,993, 29 pages.

* cited by examiner

CABLE ASSEMBLY COMPRISING A SINGLE WIRE COUPLED TO A SIGNAL LAUNCHER AND HOUSED IN A FIRST COVER PORTION AND IN A SECOND FERRITE COVER PORTION

FIELD

Embodiments of the present disclosure generally relate to the field of single wire communications and in particular to providing cable arrangements for single wire communications.

BACKGROUND

Currently, conventional transmission lines (TL), comprising high speed links, are widely used to support communications between different devices. Conventional TLs have good properties to support transmission speeds reaching 10 Gbps. For transmission speeds above 10 Gbps, TLs may exhibit excessive losses. To overcome these losses, TLs may be limited to certain bandwidths, and multiple lanes may be used for signal communication. To limit cross talk, differential types of signals may also be used. However, such approach may applicable for lower bandwidths, whereas with higher bandwidths the number of lanes may need to be increased substantially. Furthermore, the losses in the TL may limit the signal travel distance.

Single wire communication (SWC) techniques may present a viable alternative to TLs at high speeds. SWC is a transmission technique that uses a single wire for data transmission, and may not require a return wire. However, for SWC to be a practical alternative to TLs, high coupling efficiency, reduction of cross talk, low cost, and power savings may need to be achieved.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for an arrangement comprising a cable assembly to provide single wire communications (SWC) for an electronic device. In one instance, the SWC cable assembly may comprise a wire having a wire end to couple with a signal launcher of an electronic device, and a first cover portion to house a first portion of the wire that extends from the wire end. The first cover portion may comprise a shape to conform to a shape of the signal launcher, and may be fabricated of a material with a dielectric constant above a threshold, in order to provide for capacitive coupling or isolation. In embodiments, the material of the first cover portion may comprise a ferro-dielectric material, such as perovskite material.

The assembly may further comprise a second cover portion coupled with the first cover portion to house a second portion of the wire that extends from the first wire portion and protrudes from the first cover portion. The second cover portion may be fabricated of a ferrite material.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Single wire communications (SWC) may employ signal launchers embedded in an electronic device for SWC signal transmission. A signal launcher may comprise a conical shape (or otherwise shaped) structure ("horn") to excite the surface wave mode (transverse electromagnetic mode, or TEM) onto an insulated single conductor transmission line (wire). With the horn placed along with the wire, the coupling of the TEM may increase dramatically, thereby increasing the efficiency of the coupling. Because of the high coupling, adjacent conductors (transmission lines) may also get affected due to cross talk. For example, a high speed cable may include multiple links, and having interference (cross talk) between adjacent links of the high speed cable may be detrimental for quality of communications.

As the signal exits the launcher, for a distance determined by the frequency and construction, a heavy radio frequency (RF) isolation may be desired, to prevent the TEM wave from influencing or getting influenced by the neighboring SWC cable. Within the horn of a signal launcher, a very high coupling may be needed, which may be provided by forming a high capacitive material around the conductor inside the signal launcher.

The embodiments of the SWC cable assembly described herein provide for high capacitive coupling within the horn of a signal launcher, high inductive rejection between the cable and the external entities, and lower cost for the cable assembly. Further, the SWC cable assembly embodiments described herein provide for robust structure, allowing for frequent makes and breaks of connection between the SWC cable assembly and a signal launcher of an electronic device.

Figure 1:
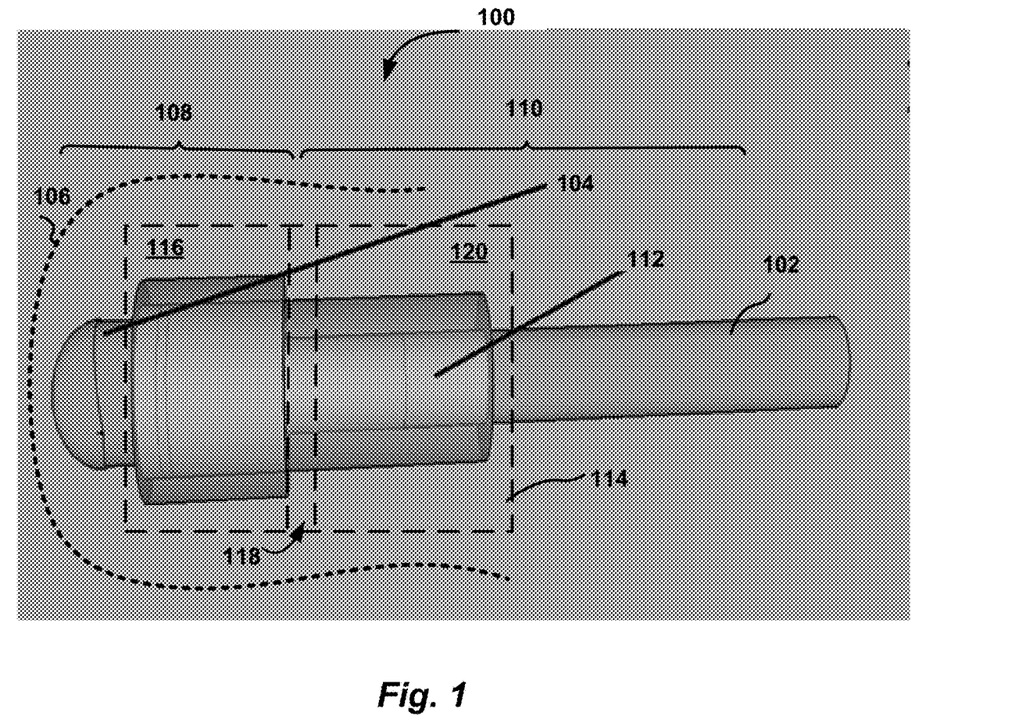
FIGS. 1-3 illustrate various views of an example SWC cable assembly for SWC for an electronic device, in accordance with some embodiments.
Figure 2:
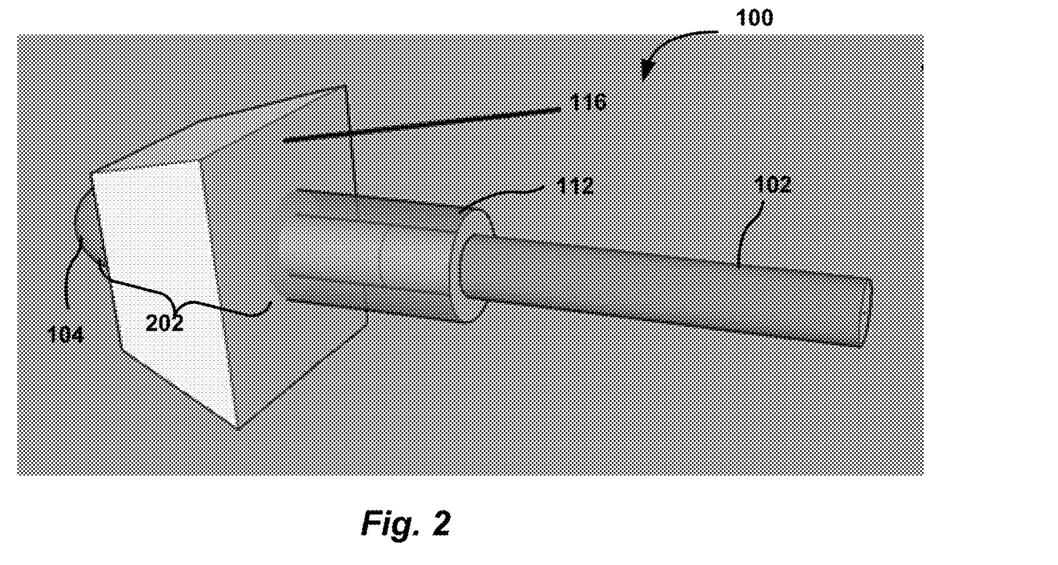
Figure 3:
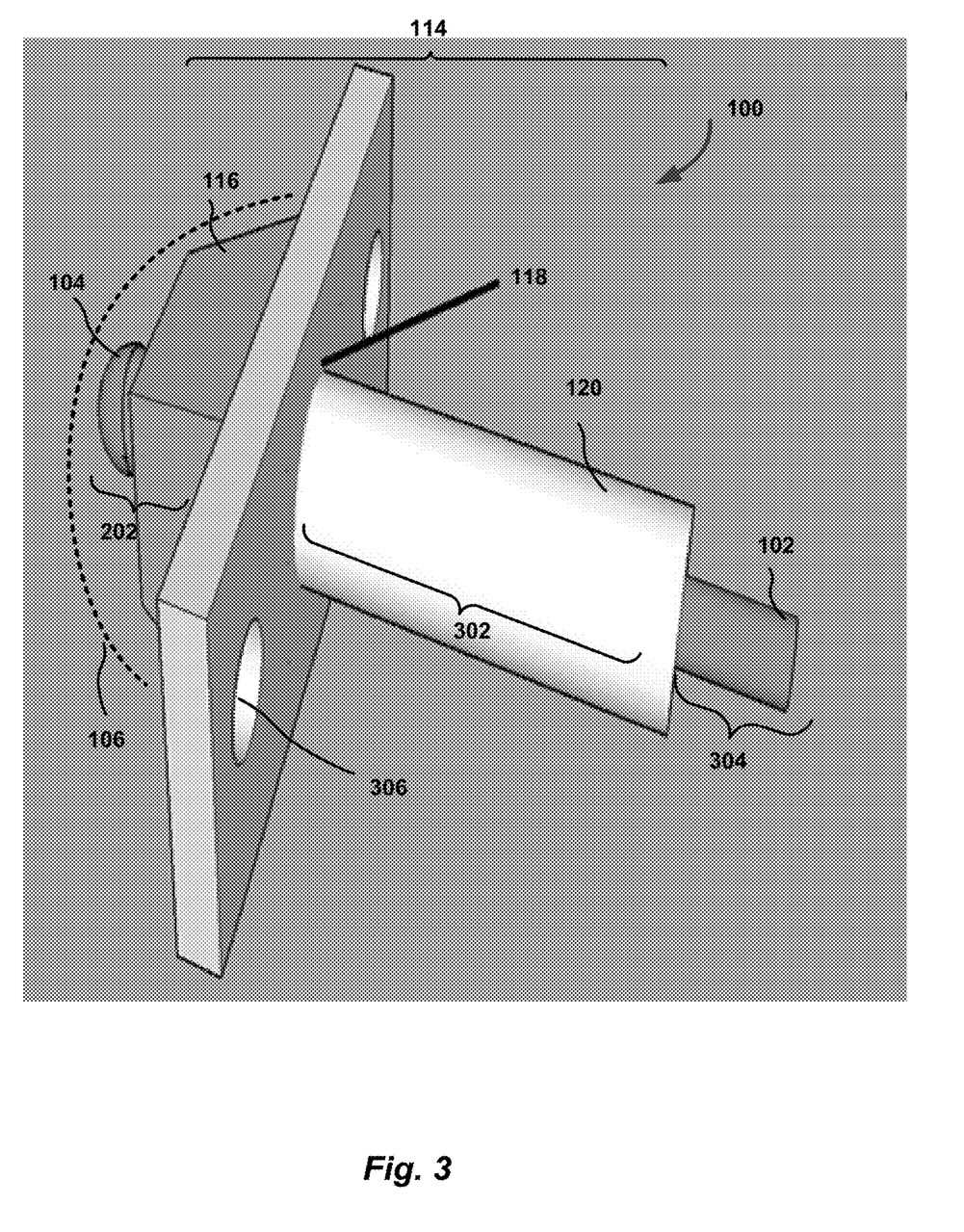

FIGS. 1-3 illustrate various views of an example SWC cable assembly for SWC for an electronic device, in accordance with some embodiments. For ease of understanding, the like components of FIGS. 1-3 are indicated by like numerals.

FIG. 1 is a side view of an example SWC cable assembly 100 in a partially assembled state, in accordance with some embodiments. The cable assembly 100 may include a wire 102 with a wire end 104, to couple with a signal launcher 106 of an electronic device (not shown), schematically illustrated by a dotted line. The wire 102 may comprise a size to carry sufficient direct current, because SWC using the cable assembly 100 may be used for both power transfer and data transmission. In embodiments, the wire 102 may comprise a copper wire.

As shown, the portion 108 of the cable assembly 100 may be insertable into, and/or removable from, the signal launcher 106. The portion 110 of the cable assembly 100 may comprise a portion of the wire 102 to carry a signal or power to a receiving end of the cable assembly 100 (not shown).

The wire connection to the middle of a horn of the signal launcher 106 may be forced to contact the horn, and such may be spring loaded for better contact resistance. Accordingly, a portion the wire 102 extending from the wire end 104 may be housed by a cover portion, or a housing 112, such as a pogo pin. For ease of understanding, the housing 112 is shown in FIG. 1 in a transparent state. For example, the wire 102 may be crimped to an end of the housing (pogo pin) 112.

In some embodiments, the cable assembly may include a cover 114, schematically shown in FIG. 1 in dashed lines, to house a portion of the wire 102 with the housing 112. As shown, the wire end 104 may protrude from the cover 114. The cover 114 may provide for reduction of cross talk and robust structure of the cable assembly 100. In embodiments, the cover 114 may comprise cover portions 116, 118, and 120, coupled together as shown. The cover 114 comprising portions 116, 118, and 120 will be described in greater detail in reference to FIGS. 2-3.

FIG. 2 is a perspective view of an example SWC cable assembly 100 in a partially assembled state, in accordance with some embodiments. More specifically, FIG. 2 illustrates the SWC cable assembly 100 with the cover portion 116 of the cover 114. As shown, the cover portion 116 may house a portion 202 of the wire 102 (with a corresponding portion of the housing 112). As shown, the wire portion 202 covered by the cover portion 116 may extend from the wire end 104, which may protrude from cover portion 116, to provide for a contact with the signal launcher (not shown in FIG. 2). As shown, the cover portion 116 comprises a shape to conform to a shape of the signal launcher, with which the cover portion 116 may be coupled (e.g., inserted into). Accordingly, a length of the cover portion 116 may corresponds to a length of a horn of the signal launcher.

In order to provide for capacitive coupling with a grounded surface of the horn of the signal launcher, the cover portion 116 may be fabricated of a ferro-dielectric material with a dielectric constant above a particular threshold, in order to provide for capacitive coupling (isolation). For example, the cover portion may be fabricated from an inorganic compound, such as a barium titanate (BaTiO3) or barium titanate oxide BaSrTiO2 or other perovskite material. In embodiments, the cover portion 116 may be fabricated by a micro particle injection moulding (PIM) process. A size of micro particles may comprise a range from about 1 um to 10 um. For example, the die may have a horn structure covering the housing (pogo pin) 112 with a riser injected with the barium titanate ceramic suspension. A die may be a mold or a tool that is used to shape material. A riser may be a part of the die or mold and may act as a conduit through which the ceramic suspension is conveyed into the mold.

FIG. 3 is a perspective view of an example SWC cable assembly 100 in an assembled state, in accordance with some embodiments. As shown, the cover portion 120 of a cover 114 may be coupled with the cover portion 116 and may house a portion of a wire 302 (and corresponding portion of the housing 112 as shown in FIGS. 1-2). The wire portion 302 may extend from the wire portion 202 and protrude from the cover portion 120. As shown, the cover portion 120 may comprise the portion 110 (FIG. 1) of the cable assembly 100 and may be disposed outside the signal launcher 106 in response to coupling of the cable assembly 100 with the signal launcher 106. The portion 110 of the cable assembly 100 including the cover portion 120 may be susceptible to interference, due to high efficacy of the signal launcher 106 or another signal launcher (not shown) disposed in the electronic device in proximity to the cable assembly 100. The cover portion 120 may comprise a length that may correspond to a signal strength and swing of the signal launcher 106. Swing of the signal refers to voltage change at the output of the driver. As speed of the signal increases, to achieve the same voltage swing at the output requires a high amount of current that can be turned on or off. Higher current drive may cause the voltage output to rise or fall faster. But with higher current the coupling with neighboring wires may also increase as the field strength increases with rapid change of current. This strong signal needs to be shielded so neighboring wires do not get disturbed.

To prevent coupling to and from the neighboring cable assembly or communication link, a high density ferrite overmoulding may be required. Accordingly, the cover portion 120 may be fabricated of a ferrite material, which may act as a floating ground field isolator. For example, a particle size of the ferrite material may be in a range from about 30 nm to about 1 um. For example, the ferrite material may comprise a nickel and zinc (NiZn) ferrite provided in a suspension. The suspension may be injected into the mold covering the wire 102. Mold (or die) is a tool which is used to give shape to the material. In this case the material is the ferrite paste. The ferrite material may also be a ceramic composite material depending on where it is being used on the cable structure. The ferrite material may be molded into shape using the mold. The final outcome may be the molded ferrite wrapping over the wire cover that may act like a shield.

In embodiments, the cover 114 may include the cover portion 118, which may be disposed between the cover portions 116 and 120. The cover portion 118 may comprise a mounting plate to mount the cable assembly 100 to an electronic device (e.g., a printed circuit board (PCB)), and include one or more mounting components 306 (e.g., pads, apertures, or the like). In embodiments, the cover portions 116, 118, and 120 may be sintered together. In embodiments, the strength of the resultant sintered cover 114 may yield high strength overmoulding for the cable assembly 100. With a very high density of the final molded part, the strength of the resultant sintered cover 114 may approach that of the parent material. If the ceramic content is high, as in the ceramic is close to 100%, the density of the final mold may be close to that of the ceramic material.

The cable assembly 100 with the cover 114 as described above may provide for desired mechanical robustness to ensure repeated coupling with and de-coupling from the signal launcher 106. Further, coupling and isolation characteristics of the SWC cable assembly 100 may provide for efficient (with a low loss) power and data transmission, and provide low assembly cost. As the cable coupling diminishes with an increase of the distance from the signal launcher, a portion 304 of the wire 102 (bare copper wire) that extends from the wire portion 302 and protrudes from the cover portion 120 may be covered by polyvinyl chloride (PVC) sheath, similar to a conventional cable.

In embodiments, the SWC cable assembly 100 may provide for power and data communications for different electronic devices and/or compute environments. For example, the SWC cable assembly may be used in a multi-die environment (e.g., multi-chip module (MCM)). In another example, the SWC cable assembly 100 may provide for SWC between a central processing unit (CPU) and other devices of a computing system (e.g., in a motherboard). In yet another example, the SWC cable assembly 100 may provide for communications between different compute components, such as in a data center environment, for example. In embodiments, the SWC cable assembly 100 may be used to couple with a printed circuit board (PCB).

Figure 4:
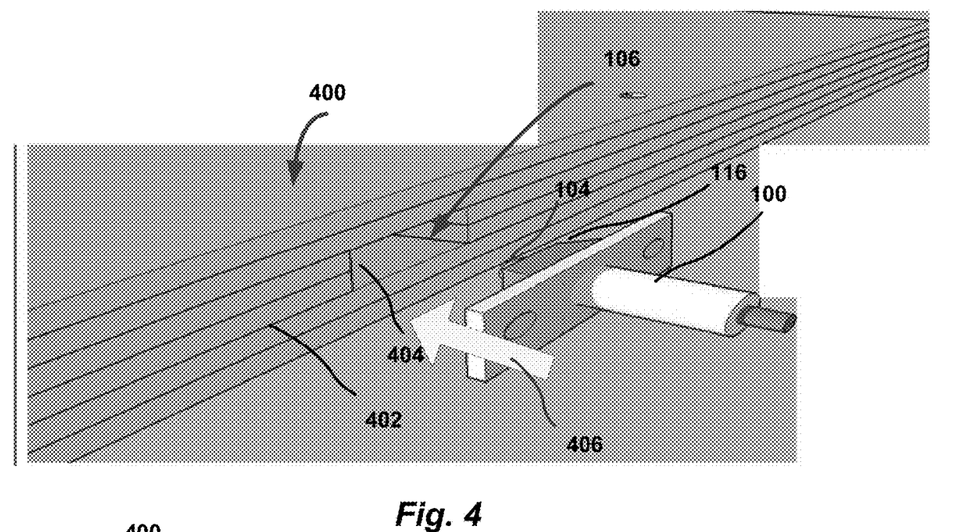
FIGS. 4-5 illustrate example coupling of the SWC cable assembly of FIGS. 1-3 to an electronic device, in accordance with some embodiments.
Figure 5:
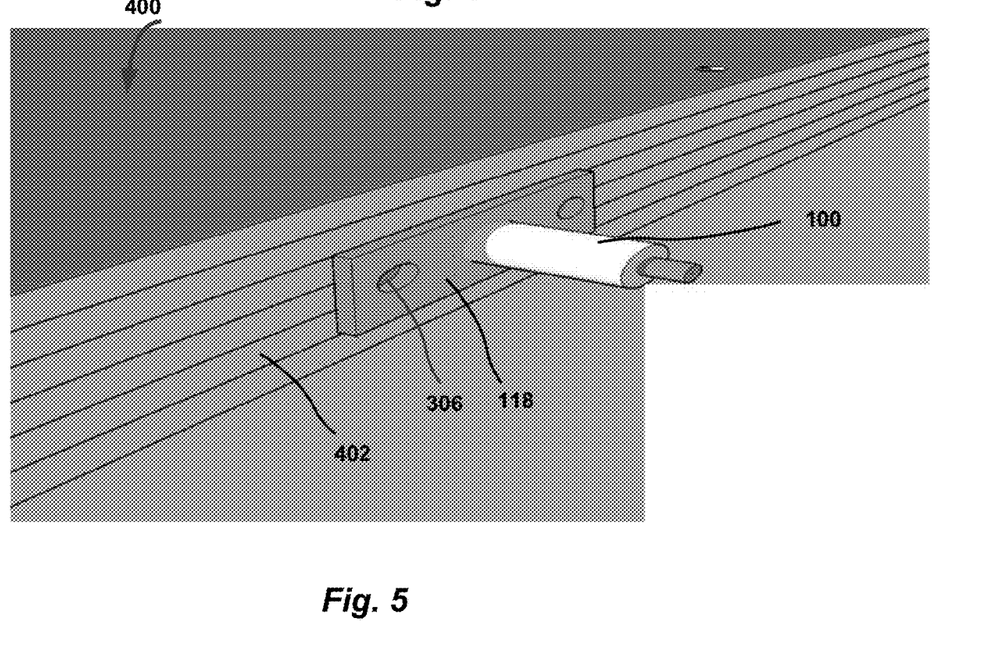

FIGS. 4-5 illustrate example coupling of the SWC cable assembly of FIGS. 1-3 to an electronic device, in accordance with some embodiments. In embodiments, the electronic device may comprise a PCB 400. As shown in FIG. 4, the signal launcher 106 of the PCB 400 may be disposed on a side 402 of the PCB 400, and comprise a horn 404. At least the portion 116 with the wire end 104 of the SWC cable assembly 100 may be coupled with the horn 404, (in response to insertion of the cable assembly into the signal launcher 106, as indicated by arrow 406.

As shown in FIG. 5, the SWC cable assembly 100 may be attached to the side 402 of the PCB 400 with the cover portion (mounting pad) 118, using the mounting components 306.

Figure 6:
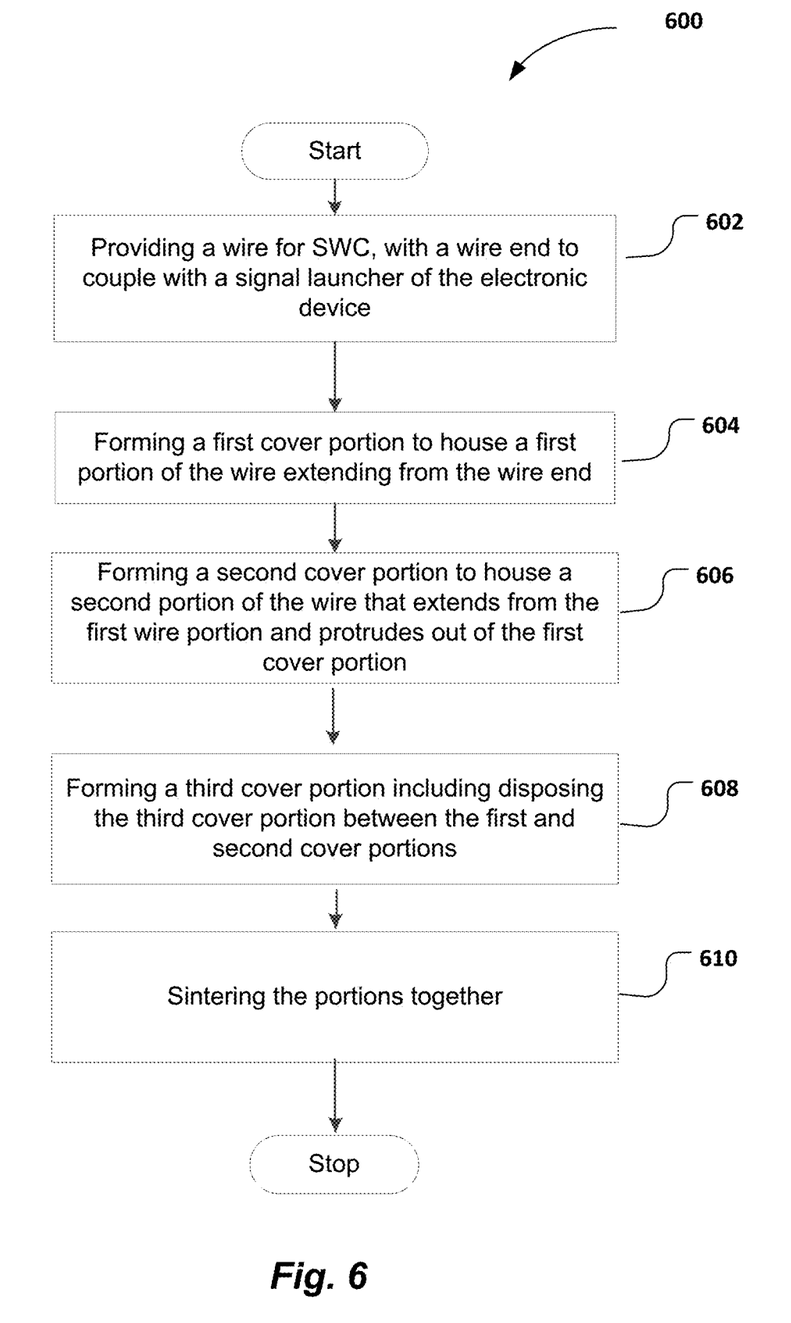
FIG. 6 is an example process flow for fabricating an SWC cable assembly providing SWC for an electronic device, in accordance with some embodiments.

FIG. 6 is an example process flow for fabricating an SWC cable assembly providing SWC for an electronic device, in accordance with some embodiments. The process 600 may comport with embodiments described in reference to FIGS. 1-5. It will be understood that at least some of the actions described in reference to different process blocks may be completed in a different order or substantially simultaneously.

The process 600 begins at Start and at block 602 may include providing a wire for SWC, with a wire end to couple with a signal launcher of the electronic device.

At block 604, the process 600 may include forming a first cover portion (e.g., 116) of a cover of the cable assembly to house a first portion of the wire (e.g., 202) extending from the wire end. As described above, the first cover portion may comprise a material with a dielectric constant above the threshold. Forming the first cover portion may include shaping the first cover portion to conform to a shape of the signal launcher of the electronic device, and fabricating the first cover portion by a micro particle injection moulding process.

At block 606, the process 600 may include forming a second cover portion (e.g., 120) to house a second portion of the wire (e.g., 302) that extends from the first wire portion and protrudes out of the first cover portion. Forming the second cover portion may include fabricating the cover portion of a ferrite material using a high density ferrite overmoulding process.

At block 608, the process 600 may include forming a third cover portion, including disposing the third cover portion between the first and second cover portions. As described, the third cover portion may comprise a mounting plate to attach the SWC cable assembly to the electronic device.

At block 610, the process 600 may include sintering the first, second, and third portions together, to provide the cover for the SWC cable assembly 100, after which the process 600 may stop.

Figure 7:
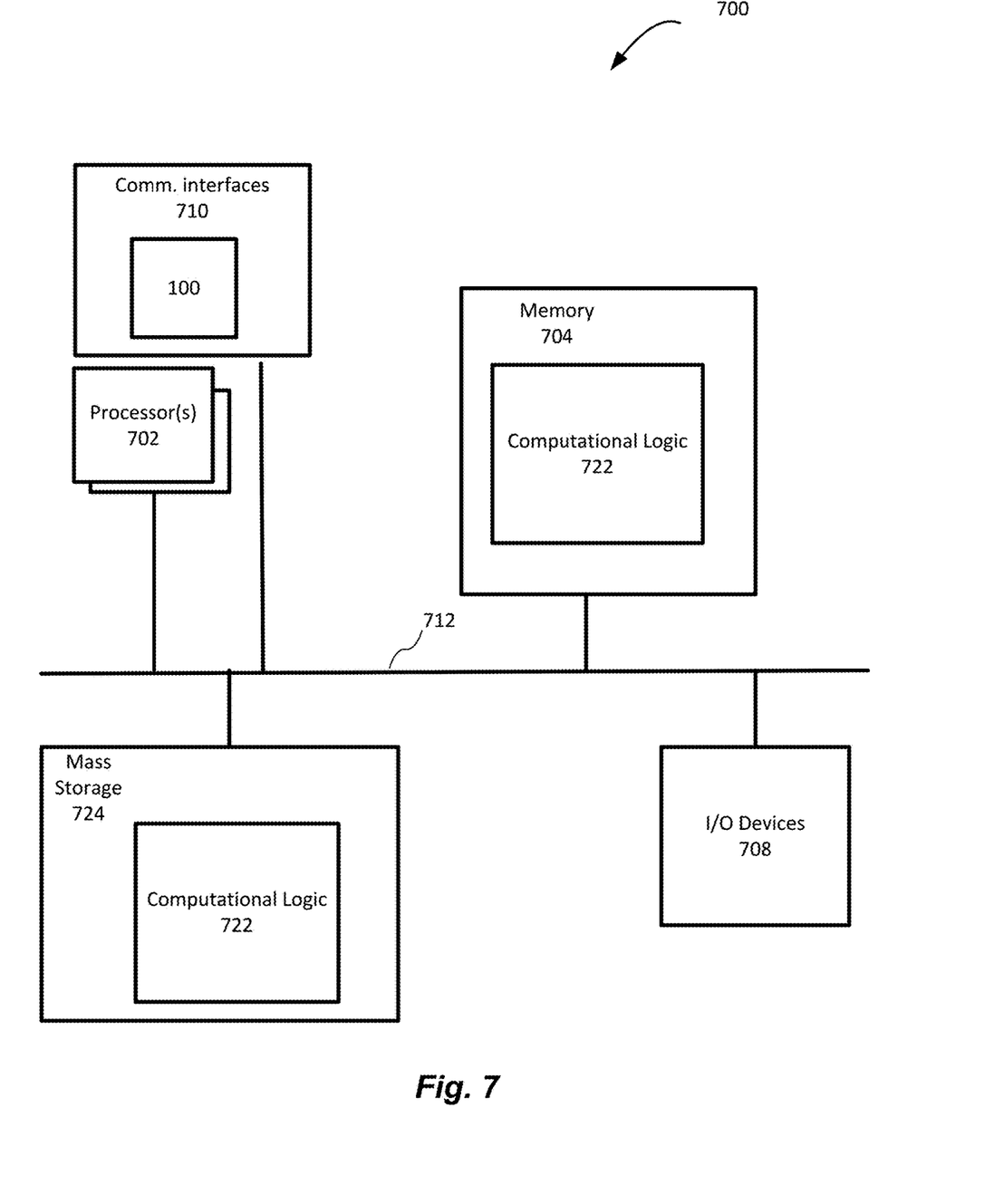
FIG. 7 illustrates an example computing device suitable for use with the SWC cable assembly of FIGS. 1-3, in accordance with some embodiments.

FIG. 7 illustrates an example computing device 700 suitable for use with the SWC cable assembly of FIGS. 1-3, in accordance with some embodiments. In some embodiments, example computing device 700 may include various components described in reference to FIGS. 1-3, such as the SWC cable assembly 100.

As shown, computing device 700 may include one or more processors or processor cores 702 and system memory 704. For the purpose of this application, including the claims, the terms "processor" and "processor cores" may be considered synonymous, unless the context clearly requires otherwise. The processor 702 may include any type of processors, such as a central processing unit (CPU), a microprocessor, and the like. The processor 702 may be implemented as an integrated circuit having multi-cores, e.g., a multi-core microprocessor.

The computing device 700 may include mass storage devices 724 (such as solid state drives, volatile memory (e.g., dynamic random-access memory (DRAM), and so forth)). In general, system memory 704 and/or mass storage devices 724 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 700 may further include input/output (I/O) devices 708 (such as display, soft keyboard, touch sensitive screen, image capture device, and so forth) and communication interfaces 710 (such as network interface cards, modems, infrared receivers, radio receivers (e.g., Near Field Communication (NFC), Bluetooth, WiFi, 4G/5G Long Term Evolution (LTE), and so forth)).

The communication interfaces 710 may include communication chips (not shown) that may be configured to operate the device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as third generation (3G), fourth generation (4G), fifth generation (5G), and beyond. The communication interfaces 710 may operate in accordance with other wireless protocols in other embodiments.

In some embodiments, the communication interfaces 710 may comprise the SWC cable assembly 100 of FIGS. 1-3. The SWC cable assembly 100 may be provided, for example, to enable communications between the processors 702 and other components of the computing device 700 or another (e.g., external) apparatus (not shown), via the I/O devices 708.

The above-described computing device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and mass storage devices 724 may be employed to store a working copy and a permanent copy of the programming instructions implementing firmware, an operating system and/or one or more applications to be executed on the computing device 700. Some of the firmware may configure, control and/or operate the integrated circuits associated with the SWC cable assembly described in reference to FIGS. 1-3, collectively denoted as computational logic 722. Computational logic 722 may be implemented in assembler instructions supported by processor(s) 702 or high-level languages that may be compiled into such instructions.

The number, capability, and/or capacity of the elements 708, 710, 712 may vary, depending on whether computing device 700 is used as a mobile computing device, such as a tablet computing device, laptop computer, game console, or smartphone, or a stationary computing device, such as a set-top box, a desktop computer or a server. Their constitutions are otherwise known, and accordingly will not be further described.

At least one of processors 702 may be packaged together with memory having computational logic 722 to form a System in Package (SiP) or a System on Chip (SoC). In various implementations, the computing device 700 may comprise a mobile computing device, such as a smartphone, a tablet, a personal digital assistant (PDA), an ultra mobile PC, or any other mobile computing device. In various embodiments, the computing device may comprise a laptop, a netbook, or a notebook. In further implementations, the computing device 700 may be any other electronic device that processes data.

The following paragraphs describe examples of various embodiments.

Example 1 may be a cable assembly to provide single wire communications (SWC) for an electronic device, comprising: a wire having a wire end to couple with a signal launcher of the electronic device; a first cover portion to house a first portion of the wire, wherein the first wire portion extends from the wire end, wherein the first cover portion comprises a shape to conform to a shape of the signal launcher, and comprises a material with a dielectric constant above a threshold; and a second cover portion coupled with the first cover portion to house a second portion of the wire that extends from the first wire portion and protrudes from the first cover portion, wherein the second cover portion comprises a ferrite material.

Example 2 may include the cable assembly of example 1, further comprising a third cover portion disposed between the first and second cover portions, wherein the first, second, and third cover portions are sintered together.

Example 3 may include the cable assembly of example 2, wherein the third cover portion comprises a mounting plate to attach the cable assembly to the electronic device.

Example 4 may include the cable assembly of example 1, wherein the first cover portion comprises a capacitive isolator, wherein the material with a dielectric constant above a threshold comprises an inorganic compound, wherein the inorganic compound comprises barium titanate ($BaTiO_3$).

Example 5 may include the cable assembly of example 4, wherein the first cover portion is fabricated by a micro particle injection moulding process, wherein a size of micro particles comprises a range from about 1 um to about 10 um.

Example 6 may include the cable assembly of example 1, wherein the first cover portion has a length that corresponds to a length of a horn of the signal launcher.

Example 7 may include the cable assembly of example 1, wherein the ferrite material of the second cover portion comprises a field isolator, wherein the second cover portion is fabricated by a high density ferrite overmoulding process, wherein a particle size of the ferrite material comprises a range from about 30 nm to about 1 um.

Example 8 may include the cable assembly of example 7, wherein the ferrite material comprises a nickel and zinc (NiZn) ferrite.

Example 9 may include the cable assembly of example 1, wherein the second cover portion comprises a length that corresponds to a signal strength of the signal launcher.

Example 10 may include the cable assembly of example 2, further comprising a housing, to house the first and second wire portions, wherein the first and second cover portions are disposed to cover the housing.

Example 11 may include the cable assembly of example 1, wherein the housing comprises a pogo pin, wherein the first and second wire portions are crimped inside the pogo pin, wherein the wire end protrudes out of the pogo pin.

Example 12 may include the cable assembly of any examples 1 to 11, wherein the electronic device comprises a printed circuit board (PCB), wherein the signal launcher is disposed on a side of the PCB, wherein a horn of the signal launcher comprises a conical shape.

Example 13 may be a system for single wire communications (SWC), comprising: an electronic device, including a signal launcher to launch signals for the SWC; and a cable assembly to provide the SWC for the electronic device, comprising: a wire having a wire end to couple with the signal launcher of the electronic device; a first cover portion to house a first portion of the wire, wherein the first wire portion extends from the wire end, wherein the first cover portion comprises a shape to conform to a shape of the signal launcher, and comprises a material with a dielectric constant above a threshold; and a second cover portion coupled with the first cover portion to house a second portion of the wire that extends from the first wire portion and protrudes out of the first cover portion, wherein the second cover portion comprises a ferrite material.

Example 14 may include the system of example 13, further comprising a third cover portion disposed between the first and second cover portions, wherein the first, second, and third cover portions are sintered together.

Example 15 may include the system of example 13, wherein the first cover portion comprises a capacitive isolator, wherein the material with a dielectric constant above a threshold comprises an inorganic compound, wherein the inorganic compound comprises barium titanate ($BaTiO_3$).

Example 16 may include the system of example 13, wherein the ferrite material of the second cover portion comprises a field isolator, wherein the second cover portion is fabricated by a high density ferrite overmoulding process, wherein a particle size of the ferrite material comprises a range from about 30 nm to 1 um.

Example 17 may include the system of example 16, wherein the ferrite material of the second cover portion comprises a field isolator, wherein the second cover portion is fabricated by a high density ferrite overmoulding process, wherein a particle size of the ferrite material comprises a range from about 30 nm to 1 um.

Example 18 may include the system of example 14, further comprising a housing, to house the first and second wire portions, wherein the first and second cover portions are disposed to house the housing, wherein the housing comprises a pogo pin.

Example 19 may include the system of any examples 13 to 18, wherein the electronic device comprises one of: a multi-chip module (MCM), a motherboard, or a printed circuit board (PCB).

Example 20 may be a method of fabrication of a cable assembly to provide single wire communications (SWC) for an electronic device, comprising: forming a first cover portion of the cable assembly to house a first portion of a cable wire, including fabricating the first cover portion of a material with a dielectric constant above a threshold, and providing a shape of the first cover portion to conform to a shape of a signal launcher of the electronic device, wherein the wire includes a wire end to couple with the signal launcher, and wherein the first wire portion extends from the wire end; and forming a second cover portion of the cable assembly, including fabricating the second cover portion of a ferrite material, and coupling the second cover portion with the first cover portion to house a second portion of the wire that extends from the first wire portion and protrudes from the first cover portion.

Example 21 may include the method of example 20, further comprising: disposing a third cover portion between the first and second cover portions; and sintering the first, second, and third cover portions together.

Example 22 may include the method of example 21, further comprising: forming the third cover portion to comprise a mounting plate to attach the cable assembly to the electronic device.

Example 23 may include the method of any of examples 20 to 22, further comprising: providing a housing, to house the first and second wire portions, wherein forming the first and second cover portions includes disposing the first and second cover portions to cover the housing.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A cable assembly to provide single wire communications (SWC) for an electronic device, comprising:
    a wire having a wire end to couple with a signal launcher of the electronic device;
    a first cover portion to house a first portion of the wire, wherein the first wire portion extends from the wire end, wherein the first cover portion comprises a shape to conform to a shape of the signal launcher, and comprises a material with a dielectric constant above a threshold; and
    a second cover portion coupled with the first cover portion to house a second portion of the wire that extends from the first wire portion and protrudes from the first cover portion, wherein the second cover portion comprises a ferrite material.

2. The cable assembly of claim 1, further comprising a third cover portion disposed between the first and second cover portions, wherein the first, second, and third cover portions are sintered together.

3. The cable assembly of claim 2, wherein the third cover portion comprises a mounting plate to attach the cable assembly to the electronic device.

4. The cable assembly of claim 1, wherein the first cover portion comprises that comprises the material with a dielectric constant above a threshold further a capacitive isolator, wherein the material with a dielectric constant above a threshold comprises an inorganic compound, wherein the inorganic compound comprises barium titanate ($BaTiO_3$).

5. The cable assembly of claim 4, wherein the first cover portion is fabricated by a micro particle injection moulding process, wherein a size of micro particles comprises a range from about 1 um to about 10 um.

6. The cable assembly of claim 1, wherein the first cover portion has a length that corresponds to a length of a horn associated with the signal launcher.

7. The cable assembly of claim 1, wherein the ferrite material of the second cover portion comprises a field isolator, wherein the second cover portion is fabricated by a high density ferrite overmoulding process, wherein a particle size of the ferrite material comprises a range from about 30 nm to about 1 um.

8. The cable assembly of claim 7, wherein the ferrite material comprises a nickel and zinc (NiZn) ferrite.

9. The cable assembly of claim 1, wherein the second cover portion comprises a length that corresponds to a signal strength of the signal launcher.

10. The cable assembly of claim 1, further comprising a connector housing, to house the first and second wire portions, wherein the first and second cover portions are disposed to cover the connector housing.

11. The cable assembly of claim 10, wherein the connector housing comprises a pogo pin, wherein the first and second wire portions are crimped inside the pogo pin, wherein the wire end protrudes out of the pogo pin.

12. The cable assembly of claim 1, wherein the electronic device comprises a printed circuit board (PCB), wherein the signal launcher is disposed on a side of the PCB, wherein a horn associated with the signal launcher comprises a conical shape.

13. A system for single wire communications (SWC), comprising:
- an electronic device, including a signal launcher to launch signals for the SWC; and
- a cable assembly to provide the SWC for the electronic device, comprising:
  - a wire having a wire end to couple with the signal launcher of the electronic device;
  - a first cover portion to house a first portion of the wire, wherein the first wire portion extends from the wire end, wherein the first cover portion comprises a shape to conform to a shape of the signal launcher, and comprises a material with a dielectric constant above a threshold; and
  - a second cover portion coupled with the first cover portion to house a second portion of the wire that extends from the first wire portion and protrudes out of the first cover portion, wherein the second cover portion comprises a ferrite material.

14. The system of claim 13, further comprising a third cover portion disposed between the first and second cover portions, wherein the first, second, and third cover portions are sintered together.

15. The system of claim 13, wherein the first cover portion that comprises the material with a dielectric constant above a threshold further comprises a capacitive isolator, wherein the material with a dielectric constant above a threshold comprises an inorganic compound, wherein the inorganic compound comprises barium titanate ($BaTiO_3$).

16. The system of claim 13, wherein the ferrite material of the second cover portion comprises a field isolator, wherein the second cover portion is fabricated by a high density ferrite overmoulding process, wherein a particle size of the ferrite material comprises a range from about 30 nm to 1 um.

17. The system of claim 13, wherein the electronic device comprises one of: a multi-chip module (MCM), a motherboard, or a printed circuit board (PCB).

18. The system of claim 13, further comprising a connector housing, to house the first and second wire portions, wherein the first and second cover portions are disposed to house the connector housing, wherein the connector housing comprises a pogo pin.

19. A method of fabrication of a cable assembly to provide single wire communications (SWC) for an electronic device, comprising:
- forming a first cover portion of the cable assembly to house a first portion of a cable wire, including fabricating the first cover portion of a material with a dielectric constant above a threshold, and providing a shape of the first cover portion to conform to a shape of a signal launcher of the electronic device, wherein the wire includes a wire end to couple with the signal launcher, and wherein the first wire portion extends from the wire end; and
- forming a second cover portion of the cable assembly, including fabricating the second cover portion of a ferrite material, and coupling the second cover portion with the first cover portion to house a second portion of the wire that extends from the first wire portion and protrudes from the first cover portion.

20. The method of claim 19, further comprising: providing a connector housing, to house the first and second wire portions, wherein forming the first and second cover portions includes disposing the first and second cover portions to cover the connector housing.

21. The method of claim 19, further comprising:
- disposing a third cover portion between the first and second cover portions; and
- sintering the first, second, and third cover portions together.

22. The method of claim 21, further comprising: forming the third cover portion to comprise a mounting plate to attach the cable assembly to the electronic device.

* * * * *